(12) United States Patent
Tu et al.

(10) Patent No.: US 6,369,587 B1
(45) Date of Patent: Apr. 9, 2002

(54) PULSE CENTER DETECTION CIRCUIT

(75) Inventors: Jason Tu, Hsinchu; Don. Liu, Yung-Kang, both of (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 09/640,157

(22) Filed: Aug. 16, 2000

(30) Foreign Application Priority Data

Mar. 17, 2000 (TW) ............................................ 89104922

(51) Int. Cl.$^7$ ............................................... G01R 27/26

(52) U.S. Cl. ........................................ 324/678; 324/548

(58) Field of Search ................................ 324/678, 671, 324/663, 658, 679, 548

(56) References Cited

U.S. PATENT DOCUMENTS 5,659,254 A * 8/1997 Matsumoto et al. ........ 324/678

* cited by examiner

Primary Examiner—Safet Metjahic
Assistant Examiner—James Kerveros
(74) Attorney, Agent, or Firm—J. C. Patents

(57) ABSTRACT

A pulse center detection circuit, which utilizes the characteristics of the comparator combined with its positive input terminal and negative input terminal during the charging and discharging process. Thus, the comparator can output a detected pulse center signal accurately. The pulse center detection circuit of the invention utilizes an analog differential circuit in order to decrease noise interference and the pulse center can be precisely detected. Thus, the invention can be broadly used for a monitor circuit design to detect a flyback pulse center and can also be used for a general periodic pulse which requires detection of its pulse center.

17 Claims, 3 Drawing Sheets

PULSE CENTER DETECTION CIRCUIT

CROSS-REFERENCE TO RELATED APPLICATION

This application claims the priority benefit of Taiwan application serial no. 89104922, filed Mar. 17, 2000.

BACKGROUND OF THE INVENTION

1. Field of the Invention

The present invention relates to a detection circuit. More particularly, the present invention relates to a pulse center detection circuit, in which the pulse center can be exactly detected and can be broadly used for a circuit design.

2. Description of the Related Art

In general circuits, the conventional method for detecting a periodic pulse center is frequency divided by a higher pulse that has a frequency many times higher than the periodic pulse. Therefore, detecting the frequency divided pulse center by the higher pulse. According to the conventional method, a pulse that has a higher frequency is required, however, it easily generates a high frequency noise. Thus, detecting the pulse center is impossible when a detected pulse center is a pulse with a highest frequency in a system.

SUMMARY OF THE INVENTION

The invention provides a pulse center detection circuit, which comprises a switch control signal generator, a comparator, a first controlled current source, a second controlled current source, a third controlled current source, a fourth controlled current source, a first capacitor, a second capacitor, a first switch and a second switch. The switch control signal generator receives a detected pulse and generates a first switch control signal, a second switch control signal, a third switch control signal, a fourth switch control signal, a fifth switch control signal and a sixth switch control signal according to the detected pulse. Thus, the first switch control signal and the fourth switch control signal are complementary to each other, and the second switch control signal and the third switch control signal are complementary to each other. The comparator outputs a pulse center signal according to input signals imported through its positive input terminal and negative input terminal. The first controlled current source has an input terminal connected to a voltage source and an output terminal connected to the negative input terminal of the comparator. Hence, a switch state of the first controlled current source is controlled by the first switch control signal. The second controlled current source has an input terminal connected to the negative input terminal of the comparator and an output terminal connected to a ground voltage. Thus, a switch state of the second controlled current source is controlled by the second switch control signal. The third controlled current source has an input terminal connected to the voltage source and an output terminal connected to the positive input terminal of the comparator. A switch state of the third controlled current source is controlled by the third switch control signal. The fourth controlled current source has an input terminal connected to the positive input terminal of the comparator and an output terminal connected to the ground voltage. A switch state of the fourth controlled current source is controlled by the fourth switch control signal. The first capacitor is connected from the negative input terminal of the comparator to the ground voltage. The second capacitor is connected from the positive input terminal of the comparator to the ground voltage. The first switch is connected from the negative input terminal of the comparator to a reset capacitor voltage source. A switch state of the first switch is controlled by the fifth switch control signal. Moreover, the second switch is connected from the positive input terminal of the comparator to the reset capacitor voltage source. A switch state of the second switch is controlled by the sixth switch control signal. When the switch control signal generator receives the detected pulse and the detected pulse increases, the switch control signal generator generates a half cycle of the second switch control signal, the fifth switch control signal, the fourth switch control signal and the sixth switch control signal at a high level in alternation during a rise-and-fall edge of each half cycle of the detected pulse.

According to the pulse center detection circuit of the invention, when the second controlled current source and the third controlled current source are turned on, the first controlled current source, the fourth controlled current source, and the first switch and the second switch are turned off, the first capacitor is discharged and the second capacitor is charged.

According to the pulse center detection circuit of the invention, when the second controlled current source and the third controlled current source are turned off, the first switch is turned on, then the positive input terminal of the comparator maintainsthe charged voltage and its negative input terminal is connected to the reset capacitor voltage source to reset.

According to the pulse center detection circuit of the invention, when the first switch is turned off, and the first controlled current source and the fourth controlled current source are turned on, then the first capacitor is charged and the second capacitor is discharged.

According to the pulse center detection circuit of the invention, when the first controlled current source and the fourth controlled current source is turned off, the second switch is turned on, then negative input terminal of the comparator maintainsthe charged voltage and its positive input terminal is connected to the reset capacitor voltage source to reset.

The pulse center detection circuit of the invention utilizes the characteristics of the comparator combined with its positive input terminal and negative input terminal that are in the charging and discharging process. Therefore, when an input signal imported through the positive input terminal of the comparator is larger than an input signal imported through the negative input terminal of the comparator, the comparator outputs a high pulse center signal. Inversely, when an input signal imported through the positive input terminal of the comparator is smaller than an input signal imported through the negative input terminal of the comparator, the comparator outputs a low pulse center signal. Thus, the comparator can output the detected pulse center accurately via the above-described process of charging and discharging.

The pulse center detection circuit of the invention utilizes an analog differential circuit so that a flip of a noise-generated pulse center can be significantly decreased and the pulse center can be precisely detected. In addition, the high-frequency noise can be prevented and a pulse center can be detected without using a higher frequency signal. Furthermore, the invention can be broadly used for a circuit design such as a monitor circuit design to detect a flyback pulse center and also can be used for a general periodic pulse which requires detection of its pulse center.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, together with the description, serve to explain the principles of the invention. In the drawings, FIG. 1 it is a circuit diagram of a pulse center detection circuit according to a preferred embodiment of the present invention.

DESCRIPTION OF THE PREFERRED EMBODIMENTS

Figure 1:
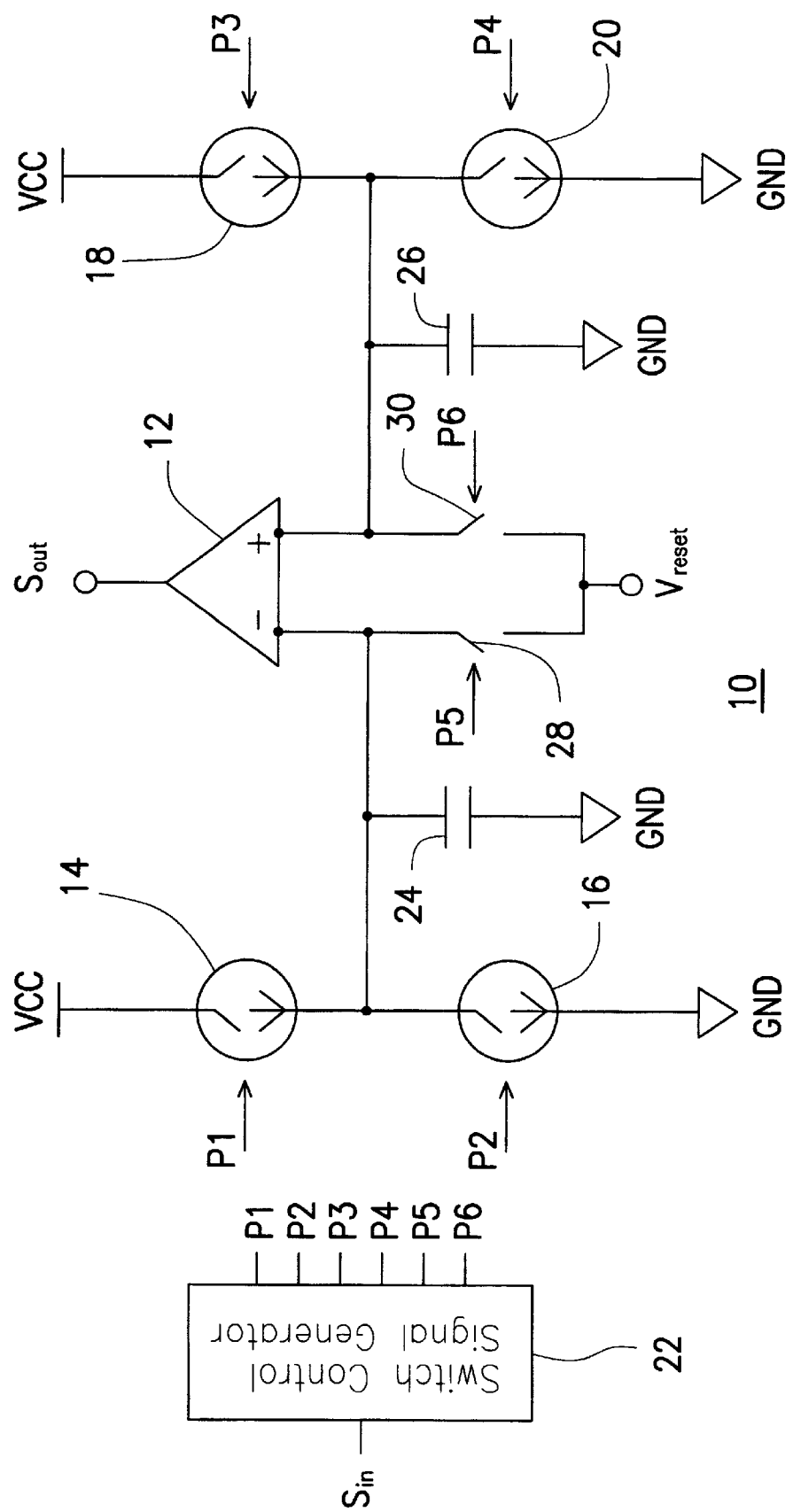

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a circuit diagram of a pulse center detection circuit according to a preferred embodiment of the present invention.

As shown in FIG. 1, a pulse center detection circuit 10 of the present invention comprises a comparator 12, four controlled current sources 14, 16, 18 and 20, a switch control signal generator 22, two capacitors 24 and 26 and two switches 28 and 30. The switch control signal generator 22 receives an input signal Sin of a detected pulse, and generates switch control signals P1, P2, P3, P4, P5 and P6 according to the input signal Sin. Hence, it controls a switch state of the controlled current sources 14, 16,18 and 20 and switches 28 and 30, respectively.

In FIG. 1, the controlled current source 14 has an input terminal connected to a voltage source VCC and a output terminal connected to a negative input terminal of the comparator 12. The controlled current source 16 has an input terminal connected to the negative input terminal of the comparator 12 and an output terminal connected to a ground voltage GND. The controlled current source 18 has an input terminal connected to the voltage source VCC and an output terminal connected to a positive input terminal of the comparator 12. The controlled current source 20 has an input terminal connected to the positive input terminal of the comparator 12 and an output terminal connected to the ground voltage GND. The capacitor 24 is connected between the negative input terminal of the comparator 12 and the ground voltage GND. The capacitor 26 is connected from the positive input terminal of the comparator 12 to the ground voltage GND. The switch 28 is connected from the negative input terminal of the comparator 12 to a reset capacitor voltage source Vreset. The switch 30 is connected from the positive input terminal of the comparator 12 to the reset capacitor voltage source Vreset. The comparator 12 outputs a pulse center signal Sout according to input signals of its positive input terminal and negative input terminal.

Figure 2:
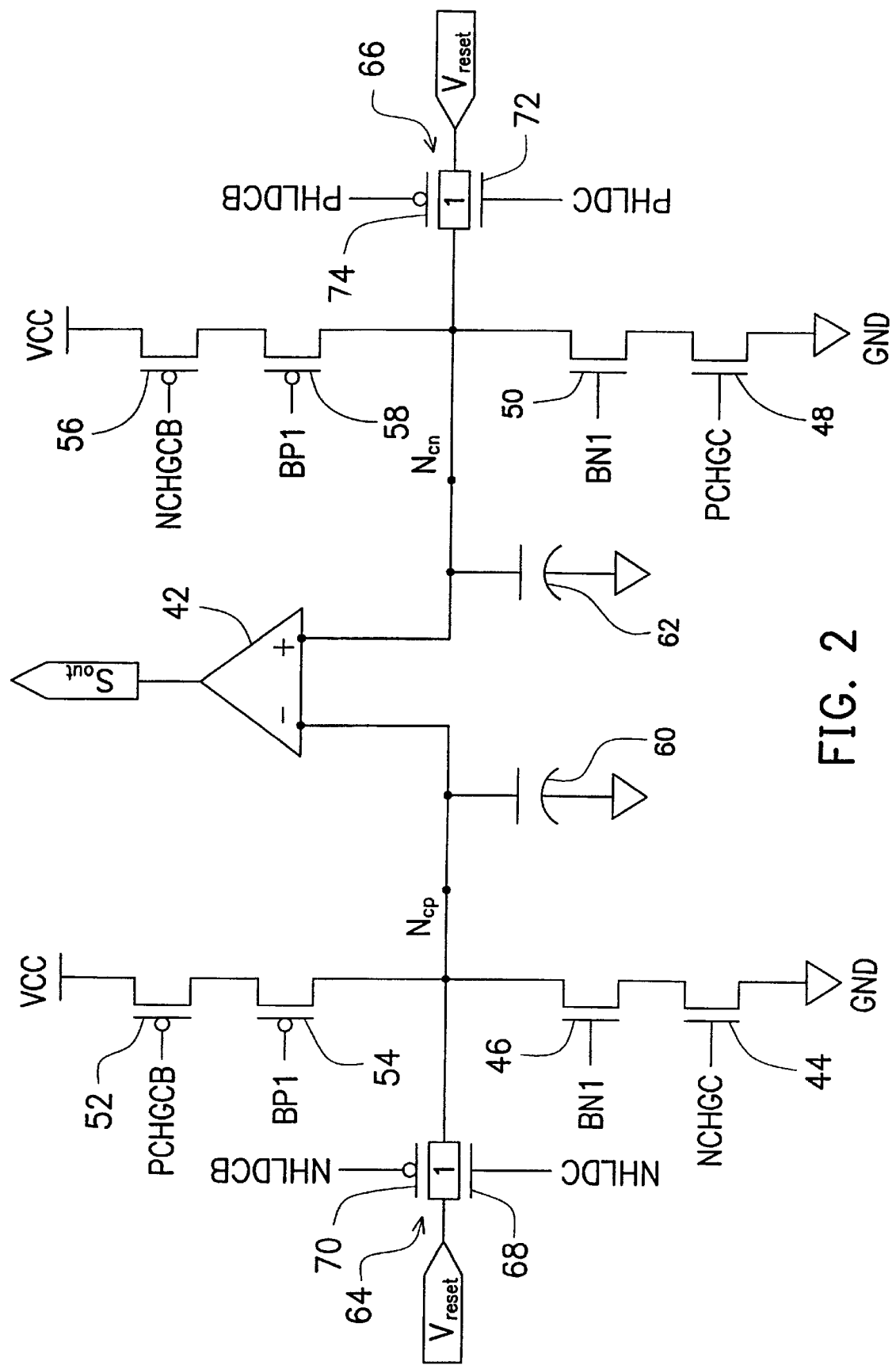
FIG. 2 is an instance diagram of a pulse center detection circuit according to the present invention.

FIG. 2 is an instance diagram of a pulse center detection circuit according to the present invention, which is an analog differential circuit and corresponds to the pulse center detection circuit 10 in FIG. 1.

As shown in FIG. 2, a pulse center detection circuit 40 comprises a comparator 42, four NMOS transistors 44, 46, 48 and 50, four PMOS transistors 52, 54, 56 and 58, two capacitors 60 and 62 and two transmission gates 64 and 66. The transmission gate 64 is composed of a parallelly-connected NMOS transistor 68 and a PMOS transistor 70, and the transmission gate 66 is composed of a parallelly-connected NMOS transistor 72 and a PMOS transistor 74.

In FIG. 2, the NMOS transistor 44 has a source terminal connected to a ground voltage GND, a gate terminal connected to a switch control signal NCHGC and a drain terminal connected to a source terminal of the NMOS transistor 46. The NMOS transistor 46 has a drain terminal connected to a negative input terminal of the comparator 42 and a gate terminal connected to a switch control signal BN1. The NMOS transistor 48 has a source terminal connected to a ground voltage GND, a gate terminal connected to a switch control signal PCHGC and a drain terminal connected to a source terminal of the NMOS transistor 50. The NMOS transistor 50 has a drain terminal connected to a positive input terminal of the comparator 42, and a gate terminal connected to the switch control signal BN1. The PMOS transistor 52 has a source terminal connected to a voltage source VCC, a gate terminal connected to a switch control signal PCHGCB, and a drain terminal connected to a source terminal of the PMOS transistor 54. The PMOS transistor 54 has a gate terminal connected to a switch control signal BP1 and a drain terminal connected to a negative input terminal of the comparator 42. The PMOS transistor 56 has a source terminal connected to a voltage source VCC, a gate terminal connected to a switch control signal NCHGCB, and a drain terminal connected to a source terminal of the PMOS transistor 58. The PMOS transistor 58 has a gate terminal connected to a switch control signal BP1 and a drain terminal connected to a positive input terminal of the comparator 42. The capacitor 60 is connected between the negative input terminal of the comparator 42 and the ground voltage GND. The capacitor 62 is connected between the positive input terminal of the comparator 42 and the ground voltage GND. The transmission gate 64 is connected between the negative input terminal of the comparator 42 and a reset capacitor voltage source Vreset. The transmission gate 64 has an N-type control terminal (as corresponding to a gate of the NMOS transistor 68) and a P-type control terminal (as corresponding to a gate of the PMOS transistor 70), which are respectively connected to a switch control signal NHLDC and a switch control signal NHLDCB. The voltage level of the switch control signals NHLDC and NHLDCB determine a switch state of the transmission gate 64. The transmission gate 66 is connected between the positive input terminal of the comparator 42 and a reset capacitor voltage source Vreset. The transmission gate 66 has an N-type control terminal (as corresponding to a gate of the NMOS transistor 72) and a P-type control terminal (as corresponding to a gate of the PMOS transistor 74), which are respectively connected to a switch control signal PHLDC and a switch control signal PHLDCB. The voltage level of the switch control signals PHLDC and PHLDCB determine a switch state of the transmission gate 66. The comparator 42 outputs a pulse center signal Sout according to input signals of its positive input terminal and negative input terminal.

In the above, the switch control signals NCHGC and NCHGCB are complementary to each other. The switch control signals PCHGC and PCHGCB are complementary to each other. The switch control signals NHLDC and NHLDCB are complementary to each other. The switch control signals PHLDC and PHLDCB are complementary to each other. Additionally, all the switch control signals are generated by the switch control signal generator 22 in FIG. 1, according to a periodic pulse Sin. Referring to FIG. 1 and FIG. 2, the switch control signal PCHGCB corresponds to P1, the switch control signal NCHGC corresponds to P2, the switch control signal NCHGCB corresponds to P3, the switch control signal PCHGC corresponds to P4, the switch control signals NHLDC and NHLDCB correspond to P5 and the switch control signals PHLDC and PHLDCBcorrespond to P6.

Figure 3:
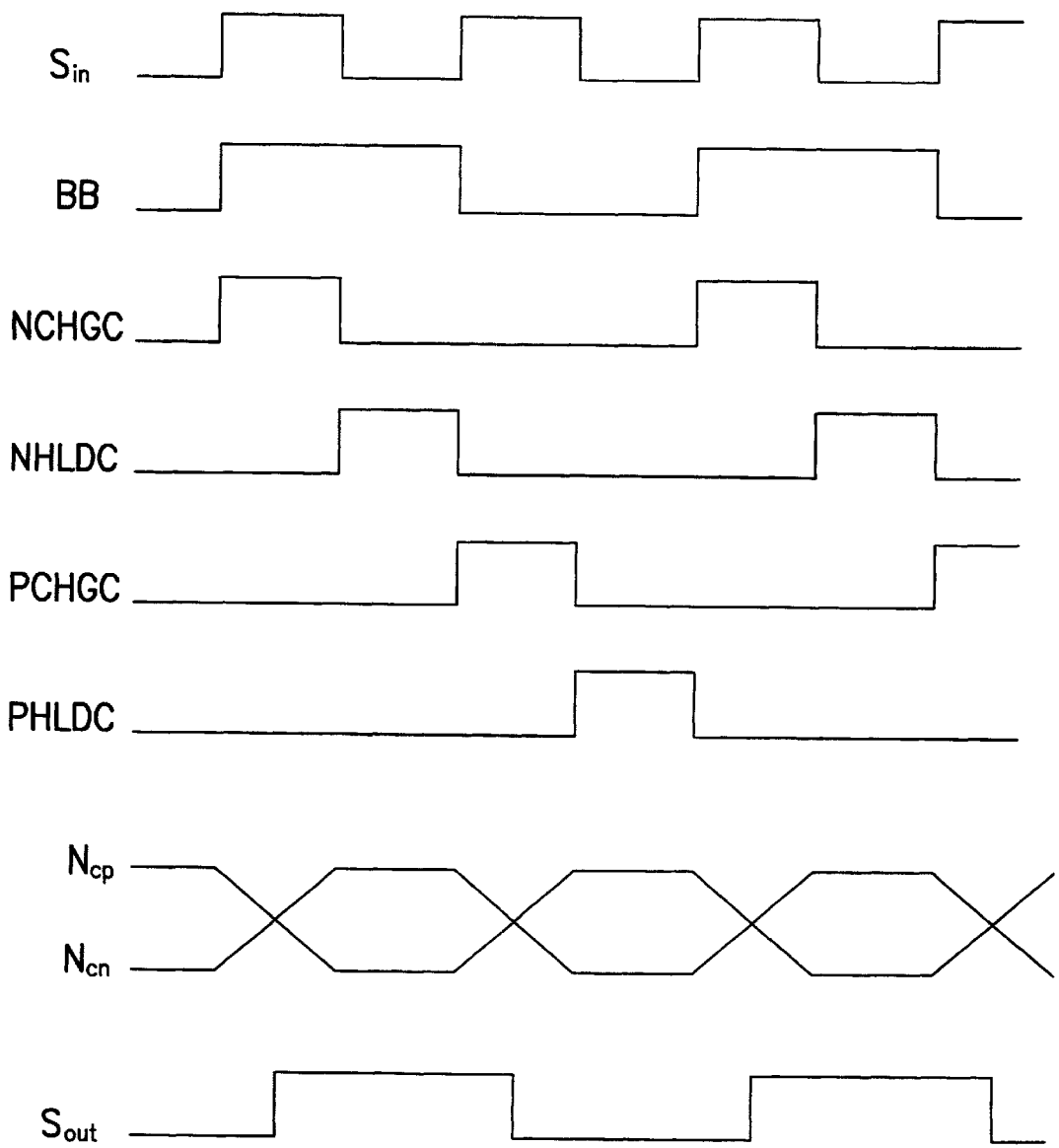
FIG. 3 is a timing diagram of various relevant signals in a pulse center detection circuit according to the present invention.

Referring to FIG. 2 and FIG. 3. FIG. 3 is a timing diagram of various relevant signals in a pulse center detection circuit according to the present invention.

As shown in FIG. 3, when the switch control signal generator 22 receives a periodic pulse Sin and the periodic pulse Sin increases, the switch control signal generator 22 generates a half cycle of switch control signals NCHGC, NHLDC, PCHGC and PHLDC in alternation during a rise-and-fall edge of each half cycle of the periodic pulse Sin.

In the following, the invention is described by a periodic pulse Sin during two cycles as an example.

When the signal NCHGC is at a high level, the signals NHLDC, PCHGC and PHLDC are at a low level. At the same time, the NMOS transistor 44 and the PMOS transistor 56 are turned on while the NMOS transistor 48 and the PMOS transistor 52 are turned off. The node Ncp is connected to the ground voltage while the node Ncn is connected to the voltage source VCC. Thus, the node Ncp is discharged (that is, the capacitor 60 is discharged) and the node Ncn is charged (that is, the capacitor 62 is charged).

When the signal NCHGC falls to a low level and the signal NHLDC rises to a high level, the NMOS transistor 44 and PMOS transistor 56 are turned off and the transmission gate 64 is turned on. Simultaneously, the node Ncn maintainsthe charged voltage and the node Ncp connected to Vreset to reset.

When the signal NHLDC falls to a low level and the signal PCHGC rises to a high level, the NMOS transistor 48 and PMOS transistor 52 are turned on while the NMOS transistor 44 and the PMOS transistor 56 are turned off. The node Ncn is connected to the ground voltage while the node Ncp is connected to the voltage source VCC. Thus, the node Ncn is discharged and the node Ncp is charged.

When the signal PCHGC falls to a low level and the signal PHLDC rises to a high level, the NMOS transistor 48 and PMOS transistor 52 are turned off and the transmission gate 66 is turned on. Simultaneously, the node Ncn is connected to Vreset to reset and the node Ncp maintainsthe charged voltage.

Next, the following is an example describing the characteristics of the comparator 42 when combined with its positive input terminal and the negative input terminal during the charging and discharging process. When an input signal Ncn imported through the positive input terminal of the comparator 42 is larger than an input signal imported through the negative input terminal of the comparator 42, the comparator 42 outputs a pulse center signal Sout at a high level. Inversely, when an input signal Ncn imported through the positive input terminal of the comparator 42 is smaller than an input signal imported through the negative input terminal of the comparator 42, the comparator 42 outputs a pulse center signal Sout at a low level. The timing of signals Ncn, Ncp and Sout are shown in FIG. 3. Thus, during the node Ncn charged (or discharged) and the node Ncp dis- charged (or charged), a signal intersection between the nodes Ncn and Ncp is a rising edge (or falling edge) of the pulse center signal Sout, that is, the signal intersection is a center of the periodic pulse Sin. Thus, the voltages in the nodes Ncn and Ncp output through the comparator 42 comprise a signal of the center.

In summary, the pulse center detection circuit of the present invention comprises the following advantages:

1. The high-frequency noise can be prevented and a pulse center can be detected without using a higher frequency signal.

2. Adopt an analog differential circuit so that a flip of a noise-generated pulse center can be significantly decreased and the pulse center can be precisely detected.

3. The invention can be broadly used for a circuit design such as a monitor circuit design to detect a flyback pulse center and can also be used for a general periodic pulse which requires detection of its pulse center.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pulse center detection circuit, comprising:

a switch control signal generator for receiving a detected pulse and generating a first switch control signal, a second switch control signal, a third switch control signal, a fourth switch control signal, a fifth switch control signal and a sixth switch control signal according to the detected pulse, wherein the first switch control signal and the fourth switch control signal are complementary to each other and the second switch control signal and the third switch control signal are complementary to each other;

a comparator for outputting a pulse center signal according to input signals imported through its positive input terminal and negative input terminal;

a first controlled current source that has an input terminal connected to a voltage source and that has an output terminal connected to the negative input terminal of the comparator, wherein a switch state of the first controlled current source is controlled by the first switch control signal;

a second controlled current source that has an input terminal connected to the negative input terminal of the comparator and has an output terminal connected to a ground voltage, wherein a switch state of the second controlled current source is controlled by the second switch control signal;

a third controlled current source that has an input terminal connected to the voltage source and that has an output terminal connected to the positive input terminal of the comparator, wherein a switch state of the third controlled current source is controlled by the third switch control signal;

a fourth controlled current source that has an input terminal connected to the positive input terminal of the comparator and that has an output terminal connected to the ground voltage, wherein a switch state of the fourth controlled current source is controlled by the fourth switch control signal;

a first capacitor is connected from the negative input terminal of the comparator to the ground voltage;

a second capacitor is connected from the positive input terminal of the comparator to the ground voltage;

a first switch is connected from the negative input terminal of the comparator to a reset capacitor voltage source, wherein a switch state of the first switch is controlled by the fifth switch control signal; and a second switch is connected from the positive input terminal of the comparator to the reset capacitor voltage source, wherein a switch state of the second switch is controlled by the sixth switch control signal;

when the switch control signal generator receives the detected pulse and the detected pulse increases, the switch control signal generator generates a half cycle of the second switch control signal, the fifth switch control signal, the fourth switch control signal and the sixth switch control signal at a high level in alternation during a rising-falling edge of each half cycle of the detected pulse.

2. The pulse center detection circuit of claim 1, wherein when the second controlled current source and the third controlled current source is turned on, the first controlled current source, the fourth controlled current source, the first switch and the second switch is turned off, so that the first capacitor is discharged and the second capacitor is charged.

3. The pulse center detection circuit of claim 2, wherein when the second controlled current source and the third controlled current source is turned off, the first switch is turned on. Thus, the positive input terminal of the comparator maintains the charged voltage and its negative input terminal is connected to the reset capacitor voltage source to reset.

4. The pulse center detection circuit of claim 3, wherein when the first switch is turned off, the first controlled current source and the fourth controlled current source is turned on, so that the first capacitor is charged and the second capacitor is discharged.

5. The pulse center detection circuit of claim 4, wherein when the first controlled current source and the fourth controlled current source is turned off, the second switch is turned on, so that the negative input terminal of the comparator maintains the charged voltage and its positive input terminal connected to the reset capacitor voltage source to reset.

6. The pulse center detection circuit of claim 1, wherein the first controlled current source comprises a first PMOS transistor, and its source terminal is connected to the voltage source, its gate terminal is connected to the first switch control signal and its drain terminal is connected to the negative input terminal of the comparator.

7. The pulse center detection circuit of claim 6, wherein the first controlled current source further comprises a second PMOS transistor, and its source terminal is connected to the drain terminal of the first PMOS transistor, its gate terminal is connected to a seventh switch control signal and its drain terminal is connected to the negative input terminal of the comparator.

8. The pulse center detection circuit of claim 1, wherein the second controlled current source comprises a first NMOS transistor, and its source terminal is connected to the ground voltage, and its gate terminal is connected to the second switch control signal and its drain terminal is connected to the negative input terminal of the comparator.

9. The pulse center detection circuit of claim 8, wherein the second controlled current source further comprises a second NMOS transistor and its source terminal is connected to the drain terminal of the first NMOS transistor, its gate terminal is connected to an eighth switch control signal and its drain terminal is connected to the negative input terminal of the comparator.

10. The pulse center detection circuit of claim 1, wherein the third controlled current source comprises a third PMOS transistor, and its source terminal is connected to the voltage source, its gate terminal is connected to the third switch control signal and its drain terminal is connected to the positive input terminal of the comparator.

11. The pulse center detection circuit of claim 10, wherein the third controlled current source further comprises a fourth PMOS transistor, its source terminal is connected to the drain terminal of the third PMOS transistor, its gate terminal is connected to a seventh switch control signal and its drain terminal is connected to the positive input terminal of the comparator.

12. The pulse center detection circuit of claim 1, wherein the fourth controlled current source comprises a third NMOS transistor, and its source terminal is connected to the ground voltage, its gate terminal is connected to the fourth switch control signal and its drain terminal is connected to the positive input terminal of the comparator.

13. The pulse center detection circuit of claim 12, wherein the fourth controlled current source further comprises a fourth NMOS transistor, and its source terminal is connected to the drain terminal of the third NMOS transistor, its gate terminal is connected to an eighth switch control signal and its drain terminal is connected to the positive input terminal of the comparator.

14. The pulse center detection circuit of claim 1, wherein the first switch that comprises a first transmission gatehas an N-type control terminal and a P-type control terminal respectively connected to the fifth switch control signal and a fifth switch control complement signal. The fifth switch control signal and the fifth switch control complement signal are complementary to each other and the voltage level of the fifth switch control signal and the fifth switch control complement signal determine a switch state of the first switch.

15. The pulse center detection circuit of claim 14, wherein the first transmission gate is composed of a parallelly connected NMOS transistor and a PMOS transistor.

16. The pulse center detection circuit of claim 1, wherein the second switch comprises a second transmission gate has an N-type control terminal and a P-type control terminal respectively connected to the sixth switch control signal and a sixth switch control complement signal, wherein the sixth switch control signal and the sixth switch control complement signal are complementary to each other and the voltage level of the sixth switch control signal and the sixth switch control complement signal determine a switch state of the second switch.

17. The pulse center detection circuit of claim 16, wherein the second transmission gate is composed of a parallelly connected NMOS transistor and a PMOS transistor.

* * * * *